United States Patent [19]

Long, Jr.

[11] Patent Number: 4,589,585

[45] Date of Patent: May 20, 1986

[54] METHOD FOR REPLACING CONTACT IN A BOARD MOUNTED CONNECTOR

[75] Inventor: Alden O. Long, Jr., Carlisle, Pa.

[73] Assignee: AMP Incorporated, Harrisburg, Pa.

[21] Appl. No.: 779,015

[22] Filed: Sep. 23, 1985

[51] Int. Cl.⁴ ........................ B23K 31/02; H05K 3/34
[52] U.S. Cl. ........................................ 228/119; 29/839
[58] Field of Search ................................ 228/119, 191; 29/402.08, 837, 838, 839

[56] References Cited

U.S. PATENT DOCUMENTS

| | | | |
|---|---|---|---|
| 2,890,390 | 6/1959 | Goodwin, Jr. | 29/402.8 |
| 3,386,056 | 5/1968 | Frydman | 29/839 |
| 3,406,246 | 10/1968 | Davidson et al. | 228/119 |
| 4,117,590 | 10/1978 | Rapp | 228/119 |
| 4,211,001 | 7/1980 | White et al. | 29/837 |
| 4,464,832 | 8/1984 | Asick et al. | 29/838 |

FOREIGN PATENT DOCUMENTS

| | | | |
|---|---|---|---|
| 2271899 | 1/1976 | France | 228/191 |

*Primary Examiner*—Nicholas P. Godici
*Assistant Examiner*—Samuel M. Heinrich
*Attorney, Agent, or Firm*—F. Brice Faller

[57] ABSTRACT

Method for replacing a single contact in an elongate connector having rows of right angle contacts with tails soldered in holes of a printed circuit board comprises steps of desoldering tail of contact, extracting the contact from the mating face, inserting a loop into the vacated contact passage from mounting face, inserting a replacement contact with a hooked tail into the vacated passage from mating face, and seating the replacement contact by using the loop to pull the hooked tail through the mounting face.

1 Claim, 6 Drawing Figures

METHOD FOR REPLACING CONTACT IN A BOARD MOUNTED CONNECTOR

BACKGROUND OF THE INVENTION

The present invention relates to a method for replacing a contact in a right angle connector which is mounted to a circuit board.

Circuit boards are generally interconnected in three dimensional arrays comprising a motherboard and a plurality of parallel daughterboards at right angles thereto. To provide pluggability, elongate electrical connectors are fixed to the motherboard in a parallel array; complementary elongate right angle connectors are fixed to the edges of respective daughterboards. The right angle connectors have a mating face at a right angle to the face mounted against the daughterboard, the contacts therein having right angle bends between the faces. Typically, the connector fixed to the motherboard has a pin array in the mating face and the connector fixed to the daughterboard has an array of socket contacts in the mating face and compliant pins or solder tails extending from the mounting face. Such connectors are sold by AMP incorporated as the AMP HDI connectors, described in AMP Data Sheet No. 81-655.

The above described connectors can be quite long and have large numbers of contacts. The AMP HDI connector, for example, is available with four rows of contacts totalling 684 positions in a connector eighteen inches long. It is thus quite expensive to replace a connector having a faulty contact. Accordingly, it would be desirable to replace only the faulty contact without removing the entire connector.

SUMMARY OF THE INVENTION

A method is provided for replacing individual contacts as desired in a right angle connector with contacts having solder tails soldered into plated through holes of a circuit board. First the contact to be replaced is desoldered, then it is extracted from the mating face. Loop means is inserted into the vacated contact passage from the mounting face, and a straight replacement contact with a hooked tail is inserted in the passage from the mating face. The tail is then pulled through the mounting face with the loop means, thus pulling the socket into the mating face. The tail of the replacement contact is then soldered to the plated through holes. The method employs means for desoldering a single tail, such as a soldering iron, and a kit comprising an extractor, an insertion tool having a loop on the end, and replacement contacts each having a hook on the end of each solder tail.

The chief advantage of the method is that any contact can be replaced without disturbing any other contacts.

DETAILED DESCRIPTION OF THE PREFERRED EMBODIMENT

Figure 1:
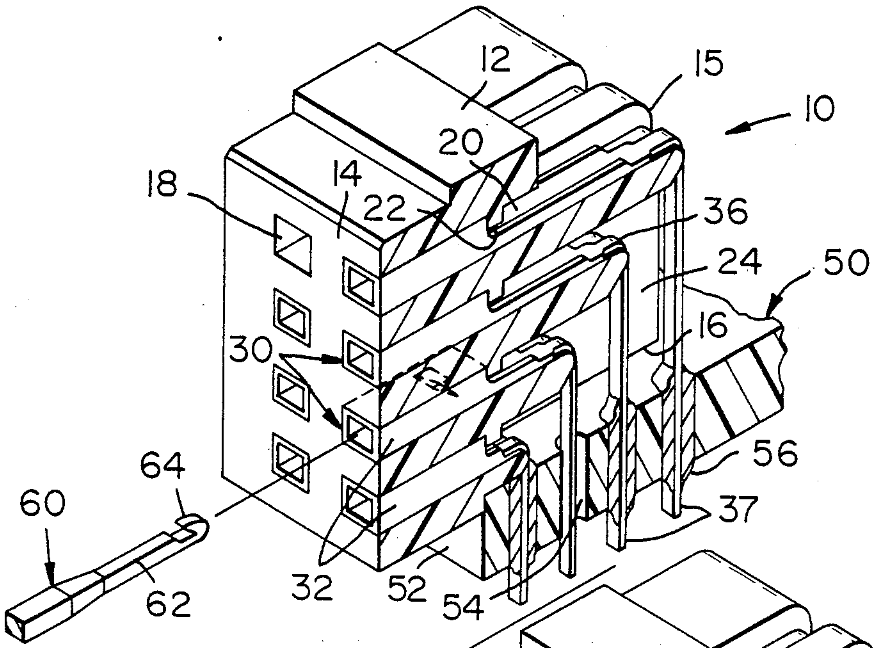
FIGS. 1 to 4 are schematic cutaway perspectives of the contact replacement sequence.

Referring to FIG. 1, an elongate connector 10 fixed to a printed circuit board 50 at edge 52 is sectioned along a plane which exposes one contact 30 in each of four rows. The connector comprises a molded dielectric housing 12 having a mating face 14, an opposed rear face 15, and a mounting face 16 at a right angle thereto. Contact receiving passages 18 extend between faces 14, 16, each passage having a closed end portion 20 toward mating face 14 and an open portion 24 toward mounting face 16. Contacts 30 each have a socket portion 32 received in closed portion 20 of a passage 18, and a solder tail 37 received in open portion 24. This permits insertion of contacts 30 in a row of passages until the sockets 32 abut stops 22 in the passages 20, the tails 37 extending toward rear face 15. Bends 36 are subsequently formed so that the tails 37 extend from face 16 for reception in plated holes 54 on board 50. This assembly procedure proceeds from the row closest to mounting face 16 to the row furthest therefrom. Solder 56 is readily applied by wave soldering.

Figure 2:
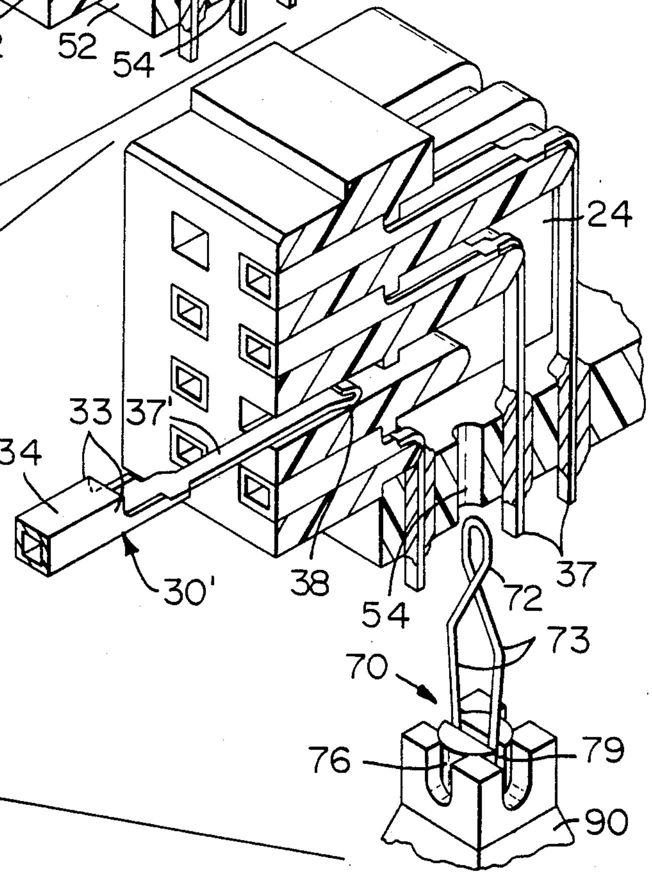

Referring still to FIG. 1, the first step in replacing a contact 30 is removal of solder 56, which is readily accomplished by heating the tail 37 concerned, as by a soldering iron. An extraction tool 60 having a probe 62 and a hook 64 on the end thereof is inserted in the socket 32 until it hits stop 22, then lifted up to engage a flap formed down from top wall 34 (FIG. 2). The contact 30 is then withdrawn from mating face 14. The contact 30 is about 0.010 in. thick at bend 36, so that the bend 36 readily "migrates" toward the end of tail 37 during withdrawal.

FIG. 2 depicts insertion tool 70 having a vertical rod 76 having fixed thereto a wire loop 72 formed from legs 73 extending from slot 79, the loop 72 being sized for reception in plated through hole 54. The rod 76 is slidably received in a nozzle 90. Replacement contact 30′ is identical to contact 30 except for the addition of loop 38 formed on the end of solder tail 37′. The extra length necessary for loop 38 is obtained by stamping same from the carrier strip for contacts 30, thus forming the longer tail 37′ necessary to form a replacement contact 30′. Contacts 30 and 30′ both have sockets 32 formed of parallel sidewalls 33 and a top wall 34 having a downwardly formed flap spaced from the ends of sidewalls 33.

Figure 3:
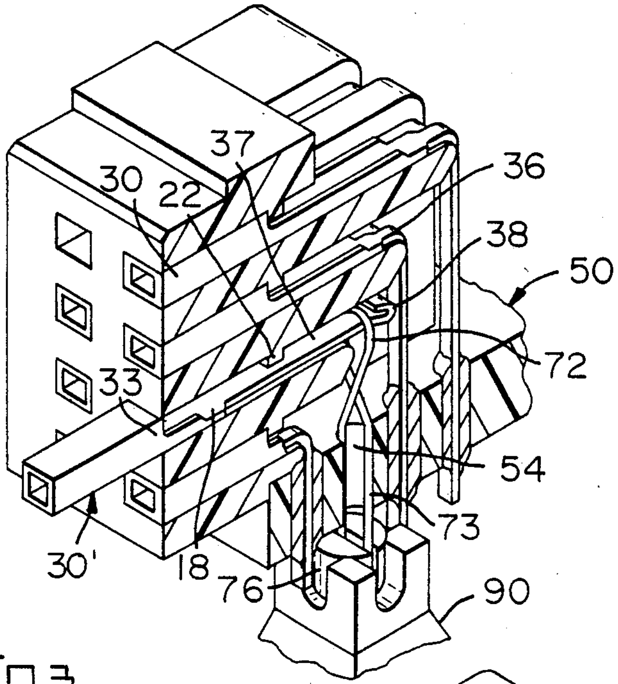
Figure 4:
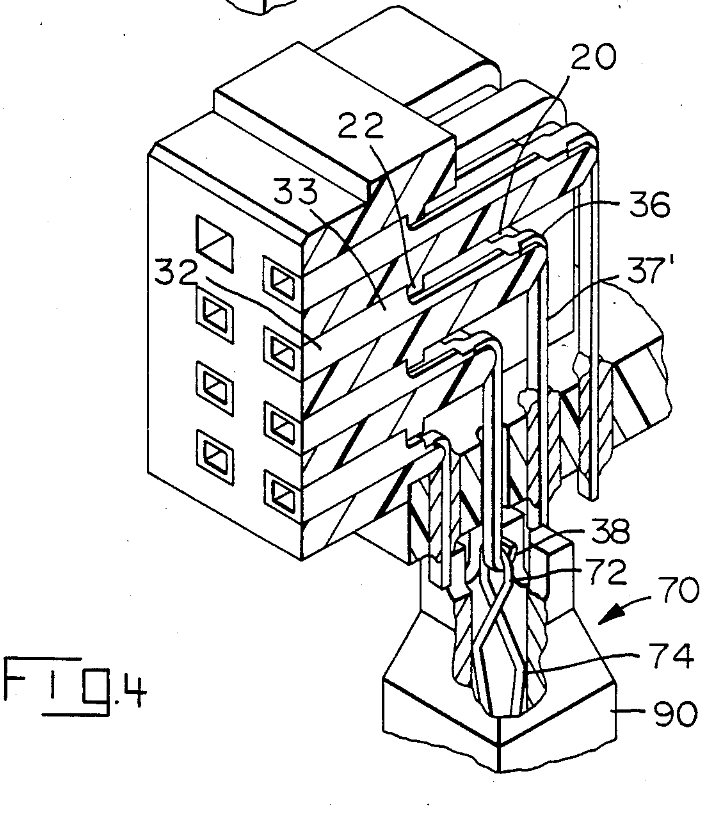

Referring to FIG. 3, the legs 73 at bowed section 74 are squeezed together in hole 54 to open loop 72 slightly for reception of hook 38 as shown, the replacement contact 30′ being inserted in passage 18 subsequent to insertion of loop 72. The contact 30′ may subsequently be drawn back slightly to be sure that the hook 38 is engaged to loop 72. The nozzle is then butted against the board 50 and the rod 76 pulled therethrough to draw the tail 37′ through hole 54 as shown in FIG. 4. This forms a bend 36, which "migrates" along the tail 37′ until sidewalls 33 abut stop 22 in the closed portion 20 of passage 18. The tool 70 is then readily removed and the tail 37′ of replacement contact 30′ can be soldered in hole 54.

Figure 5:
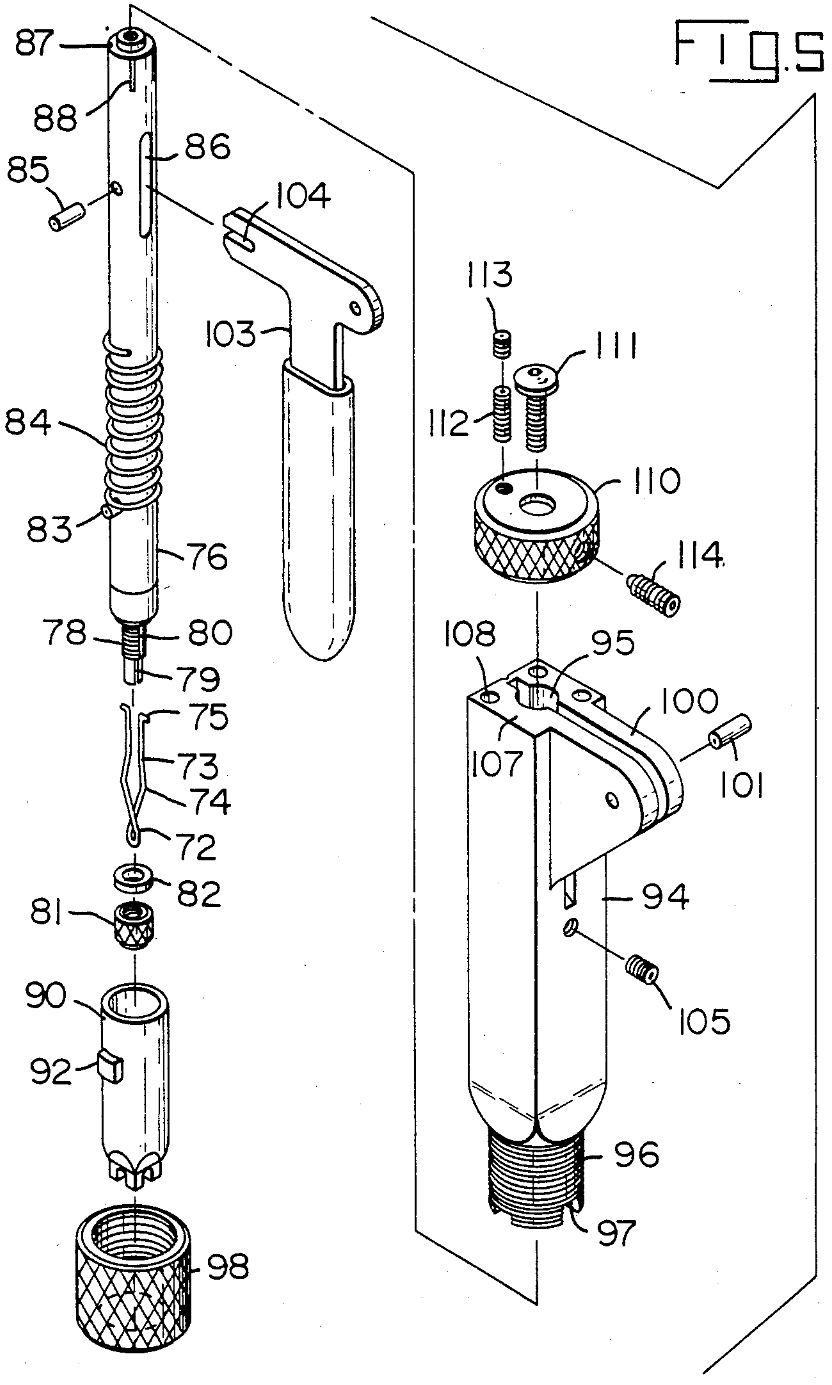
FIG. 5 is an exploded perspective of the insertion tool.
Figure 6:
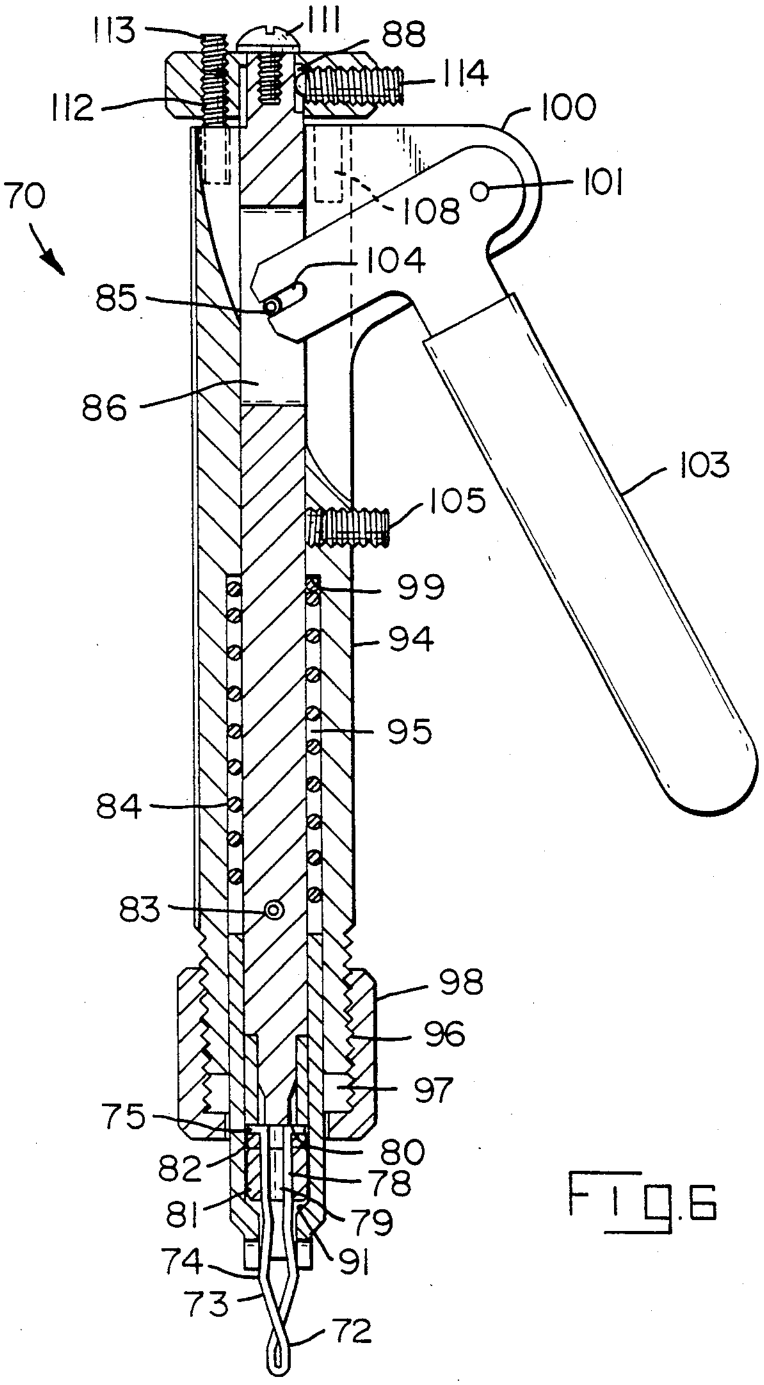
FIG. 6 is a section view of the assembled tool.

The preferred embodiment of the tool for carrying out the above described method is shown in FIGS. 5 and 6. Referring to these views collectively, the wire loop 72 is formed from legs 73 which cross over from bowed section 74 and extend to feet 75. Vertical rod 76 has a threaded nose 78 with a slot 79 thereon which receives legs 73; a ferrule 81 and washer 82 hold feet 75 against shoulder 80. A split pin 83 serves as a lower stop for coil spring 84 received concentrically on rod 76, which spring 84 bears against shoulder 99 in tool body 94 to urge the rod 76 downward. Downward travel is limited by ferrule 81 bearing against shoulder 91 in nozzle 90, from which the wire loop 72 protrudes. The tool body 94 has a threaded nose 96 having notches 97 of incrementally different depths to receive key 92 on nozzle 90, which feature allows for different circuit board thicknesses. The nozzle 90 is held in place by ferrule 98.

Referring still to FIGS. 5 and 6, the tool body 94 has an intergral handle support 100 where handle 103 pivots on pin 101. The handle 103 extends into slot 86 so that split pin 85 therethrough rides in slot 104 to slide rod 76 in bore 95 of the tool body, thus emplacing a replacement contact 30' as described in conjunction with FIGS. 3 and 4. Stop 105 is simply a threaded shank which limits travel of handle 103.

In order to position the loop 72 the necessary distance from nozzle 90 for the row in which the contact is being replaced, the shaft 76 has an adjusting disc 110 fixed to its upper end 87 with screw 111. A set screw 112 is fixed in disc 110 by locking screw 113, and extends into one of three holes 108 in upper end 107 of tool body 94. The holes 108 are of different depths, the deepest being chosed for maximum extension of loop 72. Minimum extension being obtained by butting the screw 112 against end 104 where there is no hole. The position is secured by squeezing handle 103 to move the disc 110 away from tool body 94, and twisting the disc 110 so that a spring loaded ball in detent mechanism 114 is received in one of four notches 88 at ninety degree intervals about the upper end 87 of shaft 76.

The foregoing is exemplary and not intended to limit the scope of the claims which follow.

I claim:

1. A method for replacing a contact in an electrical connector fixed to a printed circuit board, said connector being of the type having a mating face, a board mounting face at a right angle thereto, and a plurality of contact receiving passages extending therebetween, said passages having therein respective stamped and formed electrical contacts each comprising a socket at said mating face, a solder tail extending from said mounting face, and a right angle bend therebetween, said tails being soldered in respective plated through holes in said circuit board, said method comprising the following steps desoldering the tail of the contact to be replaced, extracting said contact from the mating face, inserting loop means through the plated through hole vacated by said contact and into the respective vacated passage, inserting the tail of a replacement contact into said vacated passage from said mating face, said replacement contact being straight and having a hook formed on the end of said tail, said hook being received in said loop means, pulling said loop means and said tail of said replacement contact through said plated through hole, said socket being pulled into said mating face.

* * * * *